(12) United States Patent
Rosenbluth et al.

(10) Patent No.: US 7,650,558 B2
(45) Date of Patent: Jan. 19, 2010

(54) SYSTEMS, METHODS, AND APPARATUSES FOR USING THE SAME MEMORY TYPE FOR BOTH ERROR CHECK AND NON-ERROR CHECK MEMORY SYSTEMS

(75) Inventors: Mark B. Rosenbluth, Uxbridge, MA (US); Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 532 days.

(21) Appl. No.: 11/205,645

(22) Filed: Aug. 16, 2005

(65) Prior Publication Data

US 2007/0061684 A1    Mar. 15, 2007

(51) Int. Cl.
*G11C 29/00* (2006.01)
(52) U.S. Cl. .................. 714/766; 714/767
(58) Field of Classification Search .......... 714/766, 714/767
See application file for complete search history.

(56) References Cited

U.S. PATENT DOCUMENTS

| | | | | |
|---|---|---|---|---|
| 4,730,320 | A * | 3/1988 | Hidaka et al. ............. | 714/766 |
| 7,032,158 | B2 * | 4/2006 | Alvarez et al. ............ | 714/763 |
| 7,257,763 | B1 * | 8/2007 | Srinivasan et al. ......... | 714/764 |
| 2002/0184579 | A1 * | 12/2002 | Alvarez et al. ............ | 714/719 |
| 2006/0218467 | A1 | 9/2006 | Sibigtroth et al. | |
| 2007/0220401 | A1 | 9/2007 | Baines et al. | |

OTHER PUBLICATIONS

Darnell et al., Configuring DDR2 Memory on Dell Platforms Based on the Intel E7520 and E7525 Chip Sets, White Paper Apr. 2005, pages.
Intel 865G, Intel 865P, Intel 865PE Chipset Memory Configuration Guide, White Paper May 2003, Document No. 253036-001, 13 pages.
ACER Incorporation, DDR Memory Technology, White Paper Aug. 2001.
Dell, A White Paper on the Benefits of Chipkill-Correct ECC for PDC Server Main Memory, IBM Microelectronics Division, Rev. Nov. 19, 1997, 24 pages.
"KS9246 ATAPI Automated CD-ROM Controller With Embedded DRAM", Preliminary Technical Manual, Version TM3.1, pp. 1-127.
"KS9246 ATAPI Automated CD-ROM Controller With Embedded DRAM", Preliminary Technical Manual, Version TM3.1; Relevant pp. 6 of 127, 7 of 127, 13-14 of 127 and 68-69 of 127, Total pages submitted: 1-127.
IBM, "PowerPC 6xx/7xx CPC Reference Board Manual", Version 2.4, Second Edition (Mar. 1999), Relevant pp. 15 of 178, 18 of 178, and 49 of 178, (Mar. 1999), Total pages submitted: 1-178.

* cited by examiner

*Primary Examiner*—M. Mujtaba K Chaudry
(74) *Attorney, Agent, or Firm*—Blakely, Sokoloff, Taylor & Zafman LLP

(57) ABSTRACT

Embodiments of the invention are generally directed to systems, methods, and apparatuses for using the same memory type for both error check and non-error check systems. In an embodiment, a memory device is capable of operating in an error check mode and in a non-error check mode. The memory device includes an output having N error check bit paths for every M data bit paths. In one embodiment, the memory device is to transfer N error check bits with a corresponding M data bits, if the memory device is operating in an error check mode. Other embodiments are described and claimed.

13 Claims, 10 Drawing Sheets

SYSTEMS, METHODS, AND APPARATUSES FOR USING THE SAME MEMORY TYPE FOR BOTH ERROR CHECK AND NON-ERROR CHECK MEMORY SYSTEMS

TECHNICAL FIELD

Embodiments of the invention generally relate to the field of data processing and, more particularly, to systems, methods and apparatuses for using the same memory type for both error check and non-error check memory systems.

BACKGROUND

Memory devices are susceptible to errors such as transient (or soft) errors. If these errors are not handled properly, they can cause a computing system to malfunction. Redundant information in the form of error correcting codes (ECCs) can be used to improve overall system reliability. The redundant information, however, increases the storage requirement of the memory system and, thereby, increases the cost of the memory system. Thus, ECC is typically only used on high-end or mission critical systems. Lower cost (or less critical) systems do not use ECC and provide a level of reliability which is appropriate to their usage.

In some cases, the extra bits of storage are added to the system by adding additional memory devices (e.g., dynamic random access memory (DRAM) devices). For example, a system using eight DRAMs to store data may also use an additional DRAM to store the check codes. In other cases, the extra bits are stored in a variant DRAM designed especially for use in ECC systems. For example, a non-ECC DRAM may have 256 Mbits of capacity and 16 outputs. The ECC variant of that DRAM may have 288 Mbits of capacity and 18 outputs. In both of these examples, the ECC systems have 12.5% more storage capacity than the non-ECC counterparts.

The use of different DRAM devices in ECC systems has a number of disadvantages. For example, there is an increase in costs associated with designing, manufacturing, and inventorying, two (or more) variants of a DRAM device. In addition, an ECC variant DRAM device is larger than its non-ECC counterpart and, therefore, more difficult to manufacture. Adding the extra bits to the ECC variant DRAM lowers the yield of devices and, thus, increases the cost of the devices.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to systems, methods, and apparatuses for using the same memory type in error check and non-error check systems. An error check system refers to a memory system that uses an error check code to protect the integrity of data read from memory. A non-error check system refers to a system that does not use (or is not currently using) an error check code to protect the integrity of data read from memory. As described above, the conventional way to add error check code to memory is to increase the number of bits in the memory subsystem. In contrast to the conventional approach, however, embodiments of the invention keep the total memory capacity constant, and allocate the error check bits from that capacity. As is further described below, rather than adding extra bits of storage for the error check code, existing bits in a memory device store the check code. In an embodiment, a memory controller associated with the memory device is capable of reading the error check bits in a manner that is transparent to the processor requesting the data.

Figure 1:
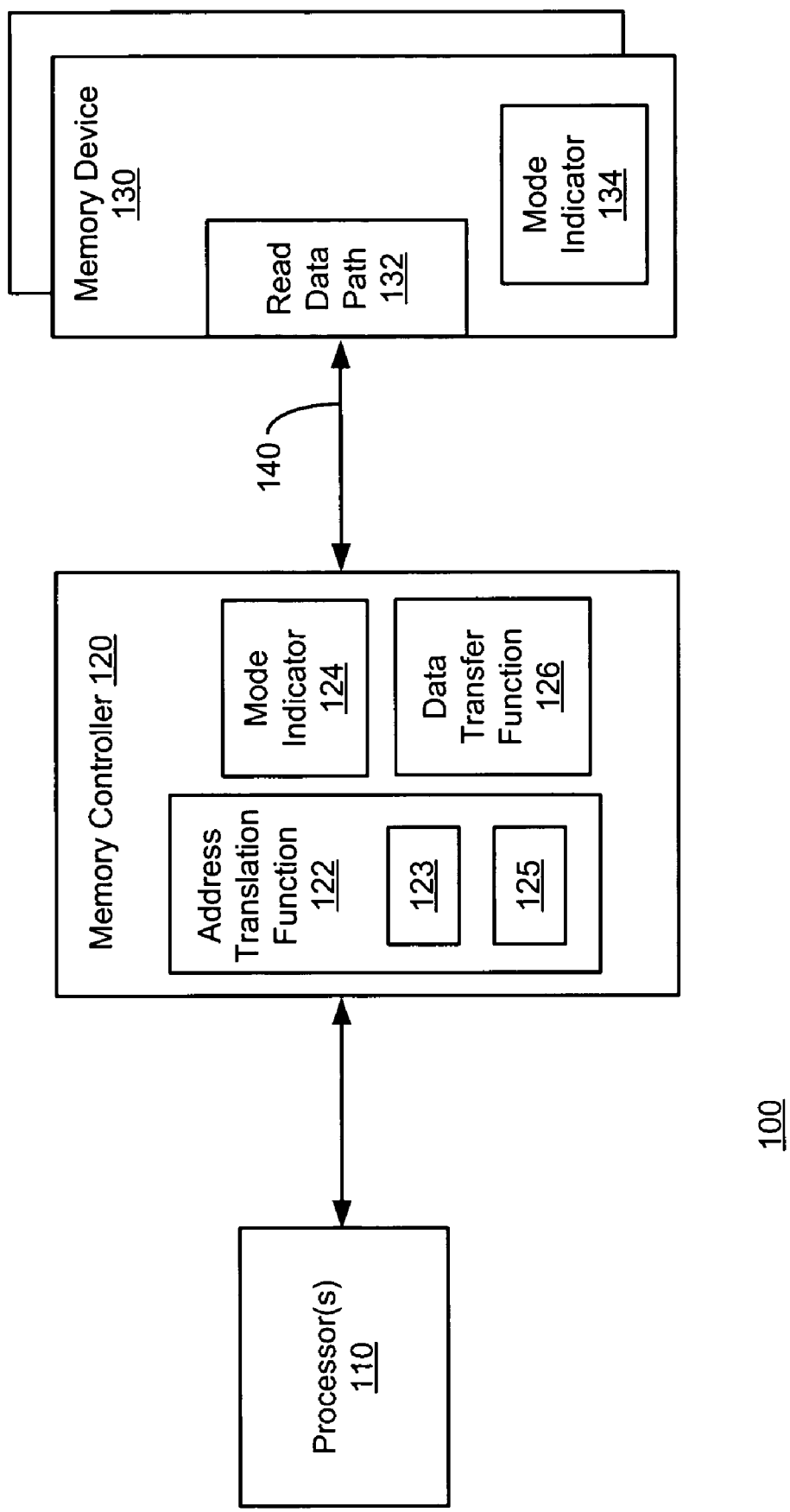
FIG. 1 is a high-level block diagram illustrating selected aspects of a memory system implemented according to an embodiment of the invention.

FIG. 1 is a high-level block diagram illustrating selected aspects of a memory system implemented according to an embodiment of the invention. System 100 includes processor (or processors) 110, memory controller 120, and memory device (or devices) 130. Processor 110 operates on data stored in memory device 130. Processor 110 may be, for example, a central processing unit, an embedded processor, a partitioned processor, a multicore processor, and the like.

Memory controller 120 controls (at least in part) the flow of data between a memory subsystem (e.g., including memory device 130) and processor 110. Memory controller 120 includes, for example, address translation function 122, mode indicator 124, and data transfer function 126. In an embodiment, memory controller 120 is capable of operating in an error check mode and in a non-error check mode. The phrase "operating in an error check mode" refers to using an error check code to identify and, in some cases, correct errors in data sent from memory device 130 to memory controller 120. The error check code may be, for example, an error correction code (ECC). Mode indicator 124 provides an indication of whether memory controller 120 is operating in the error check mode or in the non-error check mode. In one embodiment, mode indicator 124 is a mode bit indicating an operating mode of the memory controller.

Data transfer function 126 controls, at least in part, the exchange of information between memory device 130 and memory controller 120. The transfer of error check bits between memory device 130 and memory controller 120 can be implemented in a number of different ways. For example, in one embodiment, memory channel 140 includes additional traces (e.g., two additional traces) to transfer the error check bits. In an alternative embodiment, a longer (or otherwise modified) data burst is used to transfer error check bits. For example, in an embodiment, a nine clock data burst is used while operating in an error check mode and an eight clock data burst is used while operating in a non-error check mode.

As is further described below, the capacity of memory device 130 is partitioned differently based on whether memory device 130 is operating in an error check mode or a non-error check mode. The repartitioning of memory device 130 can change the mapping of a processor address to the locations in memory where the data is stored. The term "processor address" refers to the address used by a processor to specify data in a read operation. In an embodiment, address translation function 122 remaps (as needed) the processor address to the locations in memory where the requested data is stored. For ease of reference, the term "memory device address" is used to refer to the address used by memory device 130 to access data stored in memory device 130.

In an embodiment, memory device 130 can operate in an error check mode and in a non-error check mode. Read data path 132 provides both data and error check code when memory device 130 is in the error check mode. Read data path 132 is further described below with reference to FIG. 5. Mode indicator 134 provides an indication of whether memory device 130 is in the error check mode or the non-error check mode. In one embodiment, mode indicator 134 is a mode bit indicating an operating mode of memory device 130.

In one embodiment, Address translation function 122 includes detector 123 and remapper 125. Detector 123 includes logic to determine whether a processor address should be remapped to a different region in memory. Remapper 125, as the name implies, includes logic to remap the processor address if certain conditions apply. Address translation function 122 is further described below with reference to FIGS. 6-10.

Figure 2:
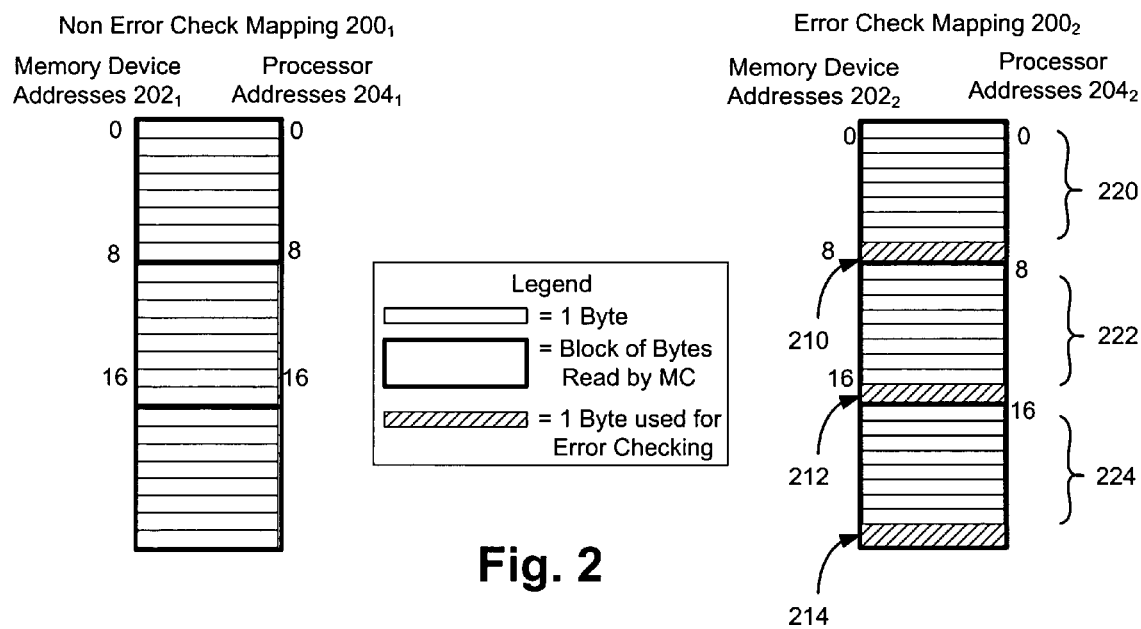
FIG. 2 is a block diagram illustrating selected aspects of partitioning the same memory device for both error-check and non-error check modes according to an embodiment of the invention.

FIG. 2 is a block diagram illustrating selected aspects of partitioning the same memory device for both error-check and non-error check modes according to an embodiment of the invention. From a logical perspective, memory device 200 is a linear array of byte sized memory locations (or simply, bytes). Each byte has an address to indicate where within the memory device it is located. In an embodiment, the partitioning of memory device 200 is different depending on whether memory device 200 is in the error-check mode or in the non-error check mode. More specifically, in an embodiment, memory device 200 is repartitioned to allocate bytes to store error check code, when memory device 200 is in the error check mode.

Memory device $200_1$ illustrates the partitioning of the memory device when it is in the non-error check mode (e.g., non-ECC mode). In one embodiment, all of the bytes of memory device $200_1$ are available for use by a processor (or other memory using component). That is, the total capacity of memory device $200_1$ is used to store data (including code) for the processor.

Memory device $200_2$ illustrates the partitioning of the memory device when it is in the error check mode (e.g., ECC mode). Memory device $200_2$ is repartitioned to allocate a fraction of its capacity to error check code (e.g., ECC). In one embodiment, $\frac{1}{8}^{th}$ of the capacity of memory device 200 is allocated for error check code. In an embodiment, the fraction of memory device 200 that is allocated for error check code is partitioned into chunks (e.g., byte or bit sized chunks) that are physically close to the data bytes that they cover. For example, error code bytes 210-214 are allocated to cover data bytes 220-224, respectively.

In operation, memory device $200_2$ provides N error bytes for every M data bytes that are read from the device. The M data bytes are provided to the reader (e.g., a processor) and the N error check bytes are used internally by the memory controller. In an embodiment, for each 8 data bytes that are read by a processor, 9 bytes are sent from memory device $200_2$ to the memory controller. The ninth byte contains error check code (e.g., ECC) that is used internally by the memory controller to detect (and possibly correct) errors in the eight data bytes. In an alternative embodiment, the ratio of N error check bytes to M data bytes may be different. For example, two error check bytes may be used to cover every eight data bytes to provide increased error detection and/or correction.

FIGS. 3-9 illustrate embodiments of the invention with reference to a memory system that uses dynamic random access memory (DRAM) devices that are organized into cache lines of 64 bytes. In alternative embodiments, different memory devices may be used and the memory devices may have a different organization. For example, in an alternative embodiment, static random access memory (SRAM) or flash memory devices may be used.

Figure 3:
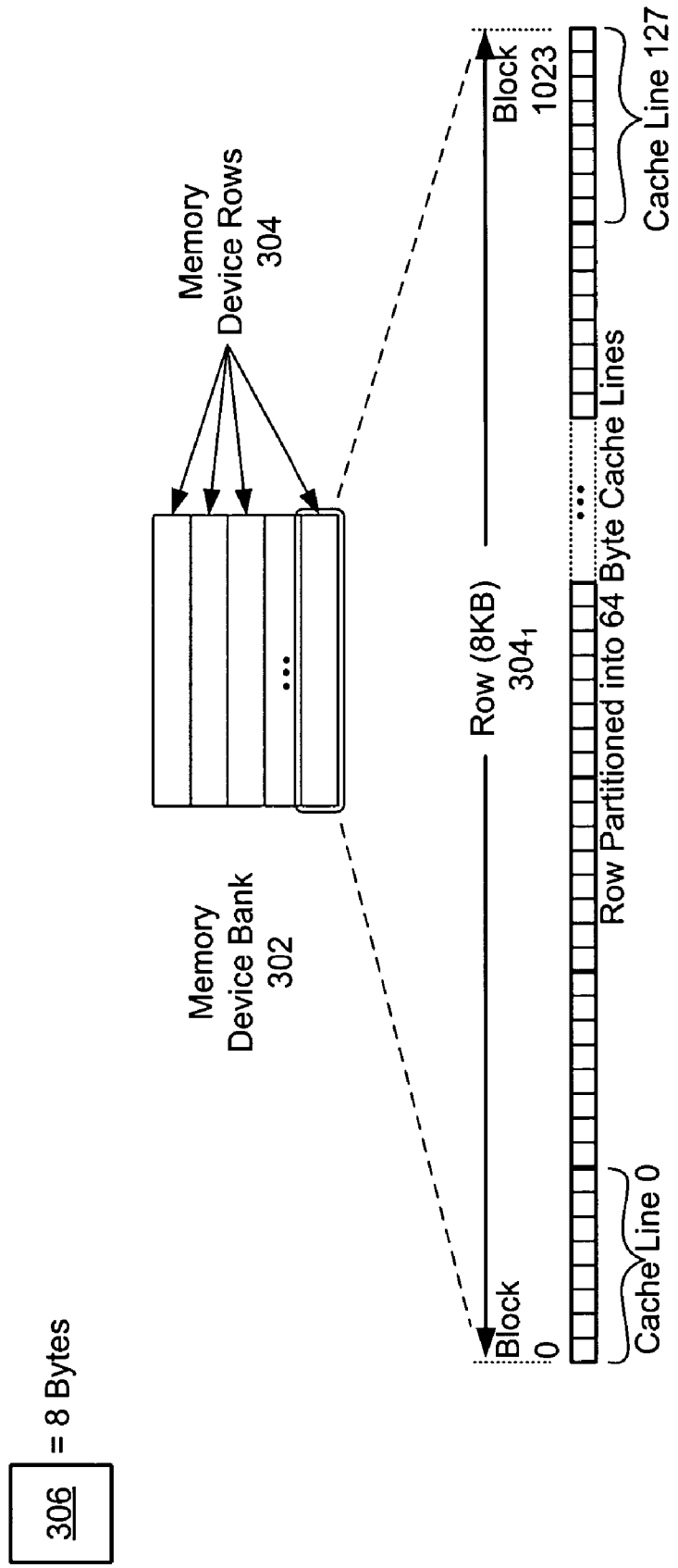
FIG. 3 is a block diagram illustrating selected aspects of the organization of a random access memory device in the non-error check mode according to an embodiment of the invention.

FIG. 3 is a block diagram illustrating selected aspects of the organization of a random access memory device in the non-error check mode according to an embodiment of the invention. In the non-error check mode, a DRAM (or other memory device) may be organized into one or more banks 302. Each bank 302 may, in turn, be organized into a plurality of rows 304. For ease of description, row $304_1$ is partitioned into 1024 blocks (e.g., block 306). Each block contains eight bytes of data to facilitate a DRAM burst access of eight bytes. A memory controller (e.g., memory controller 120, shown in FIG. 1) may further logically partition the data into cache lines (e.g., cache line 308) of 64 bytes. In an alternative embodiment, banks 302, rows 304, blocks 306, and/or cache lines 308 may be organized differently.

Figure 4:
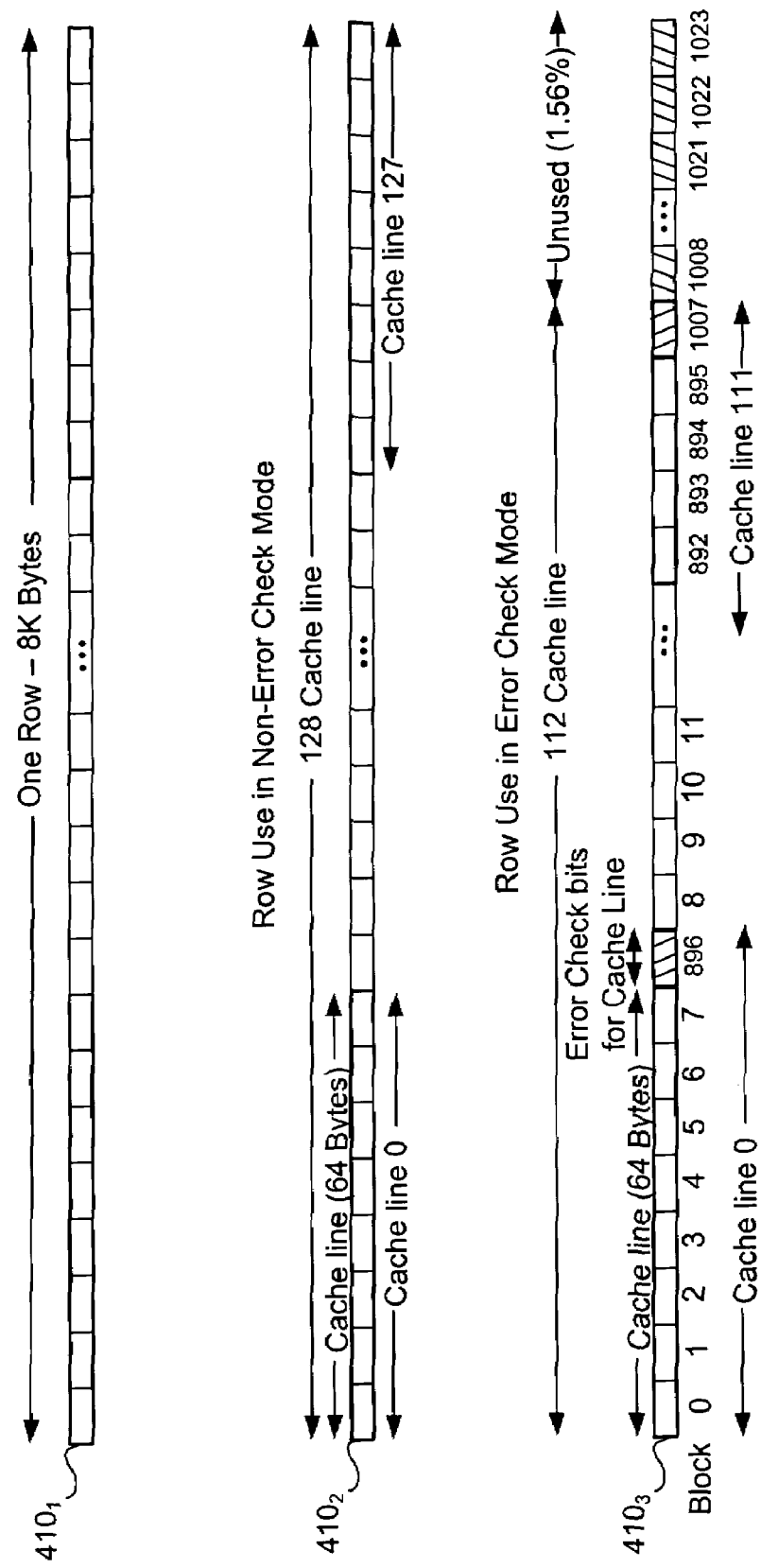
FIG. 4 is a block diagram comparing selected aspects of the structure of a row of memory in the error check mode and the non-error check mode, according to an embodiment of the invention.

FIG. 4 is a block diagram showing selected aspects of a row of memory partitioned for the error check mode and the non-error check mode, according to an embodiment of the invention. Row $410_1$ illustrates a row of DRAM memory that is organized into 1024 blocks each of which are further partitioned into 8 bytes. Rows $410_2$ and $410_3$ respectively show row 410 partitioned for the non-error check mode and the error check mode.

In the non-error check mode, row $410_2$, is organized into 128 cache lines of 64 bytes each. Each of the 128 cache lines may be read by a processor or other component. Thus, all of the bytes within row $410_2$ are accessible by a processor (e.g., via a read operation).

In an embodiment, row 410 is repartitioned to allocate a fraction of its capacity for error check bytes if the DRAM is in the error check mode. For example, row $410_3$ is partitioned to allocate $\frac{1}{8}$ of its capacity for error check bytes and $\frac{7}{8}$ of its capacity for data. Since only $\frac{7}{8}$ of the capacity of row $410_3$ is allocated for data, row $410_3$ is partitioned into fewer cache lines than row $410_2$. In the illustrated embodiment, for example, row $410_3$ is partitioned into 112 cache lines instead of 128 cache lines. The remaining $\frac{1}{8}$ of the capacity of row $410_3$ is used by the error check code (e.g., ECC) that protects the 112 cache lines.

In one embodiment, a processor can directly access the data bytes but not the error check bytes. The error check bytes are implicitly accessed along with the associated data bytes for use by the memory controller. The address mapping, however, is different for the error-check and the non-error check modes. In an embodiment, the address mapping is driven by three goals. First, all bytes in a given cache line (e.g., 64 bytes) are located on the same DRAM row to enhance performance. Also, as is further discussed with reference to FIG. 5, error check bytes (or bits) are physically located close to the data bits that they cover. Finally, address manipulation in the memory controller is kept simple to keep the logic costs low. An example of address manipulation in a memory controller is further discussed below with reference to FIG. 6.

Row $410_3$ illustrates selected aspects of the renumbering of (at least some of) the 8-byte blocks. In particular, block 896 is interspersed between blocks 7 and 8. Block 896 contains the error check code that covers cache line 0. In an embodiment there are two advantages to interspersing an error check code block (e.g., block 896) between data blocks (e.g., blocks 7 and 8). First, a processor may expect both the cache lines and the data blocks within the cache lines to be continuously numbered. As is further discussed below, however, the architecture of a DRAM (or other memory device) is simplified if the error check bytes are physically close to the data bytes that they cover. Thus, renumbering the blocks that contain the error check bytes allows those blocks to be physically close to the data they cover without interrupting the continuous numbering of the data blocks and the cache lines.

Figure 5:
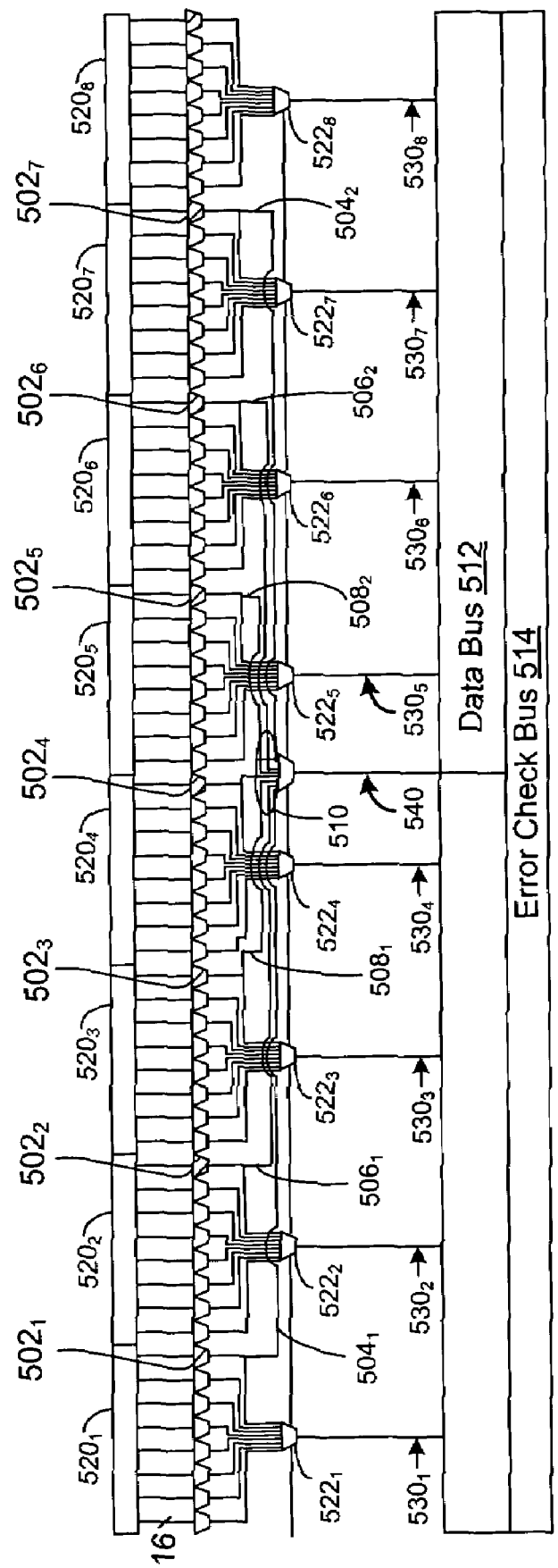
FIG. 5 is a circuit diagram illustrating selected aspects of the read data path of a memory device implemented according to an embodiment of the invention.

FIG. 5 is a circuit diagram illustrating selected aspects of the read data path of a memory device implemented according to an embodiment of the invention. The example illustrated in FIG. 5 shows 8 bits out of 128 bits, according to an embodiment of the invention. Read data path 500 includes sense amplifiers 520 providing inputs to multiplexers 522. Multiplexers 522 provide data bits to data bus 512. Read data path 500 also includes multiplexer 510 to provide an error check bit to error check bus 514. In an embodiment, read data path 500 includes N error check bits paths for every M data bit paths.

The N error check bit paths may be physically close to the data bit paths that they cover. For example, error check bit path 540 is close to data bit paths 530. In the illustrated embodiment, there is one error check bit path for every 8 data bit paths. In an alternative embodiment, the ratio of error check bit paths to data bit paths may be different. For example, in an alternative embodiment, two error check bit paths may be used to cover eight data bit paths.

One reason for keeping the error check bit paths physically close to the data bit paths that they cover is that this arrangement simplifies the wiring channels of a DRAM (or other memory device). In one embodiment, each error check bit path is interspersed between the data bit paths that they cover. For example, error check bit path 540 is interspersed between data bit paths $530_1$-$530_4$ (on the left) and data bit paths $530_5$-$530_8$ (on the right). Since error check bit path 540 is interspersed between two pairs of data bit paths only three new bit lanes are needed. The central placement of multiplexer 510 allows traces 504, 506, and 508 to share three horizontal slots (or, more precisely, three bit lanes). For example, traces $504_1$ and $504_2$ are symmetrical about multiplexer 510 and, therefore, they can share the same horizontal slot (or bit lane). Similarly, traces $506_1$-$506_2$ share a horizontal slot and traces $508_1$-$508_2$ share a horizontal slot.

In an embodiment, a fraction of the cache lines on each DRAM row does not exist, if the system is in error check mode, because the corresponding bits are used for check codes. For example, if one-eighth of the capacity of a DRAM is used for error check bits, then there is a corresponding one-eighth reduction in the number of cache lines on the DRAM. The address space as seen by a processor, however, should not have gaps. To prevent gaps in the address space, the memory controller effectively "relocates" the cache lines from where they would normally be in the DRAM to, for example, a higher address.

In an embodiment, the N error check bits may be rotated across the bit lanes of a memory device according to a set of rules (e.g., modulo the low address). That is, the N error check bits may initially be sent across a first set of N bit lanes (or lane) and subsequently sent across a different set of N bit lanes. Any suitable set of rules for governing the rotation of error check bits may be used.

Figure 6:
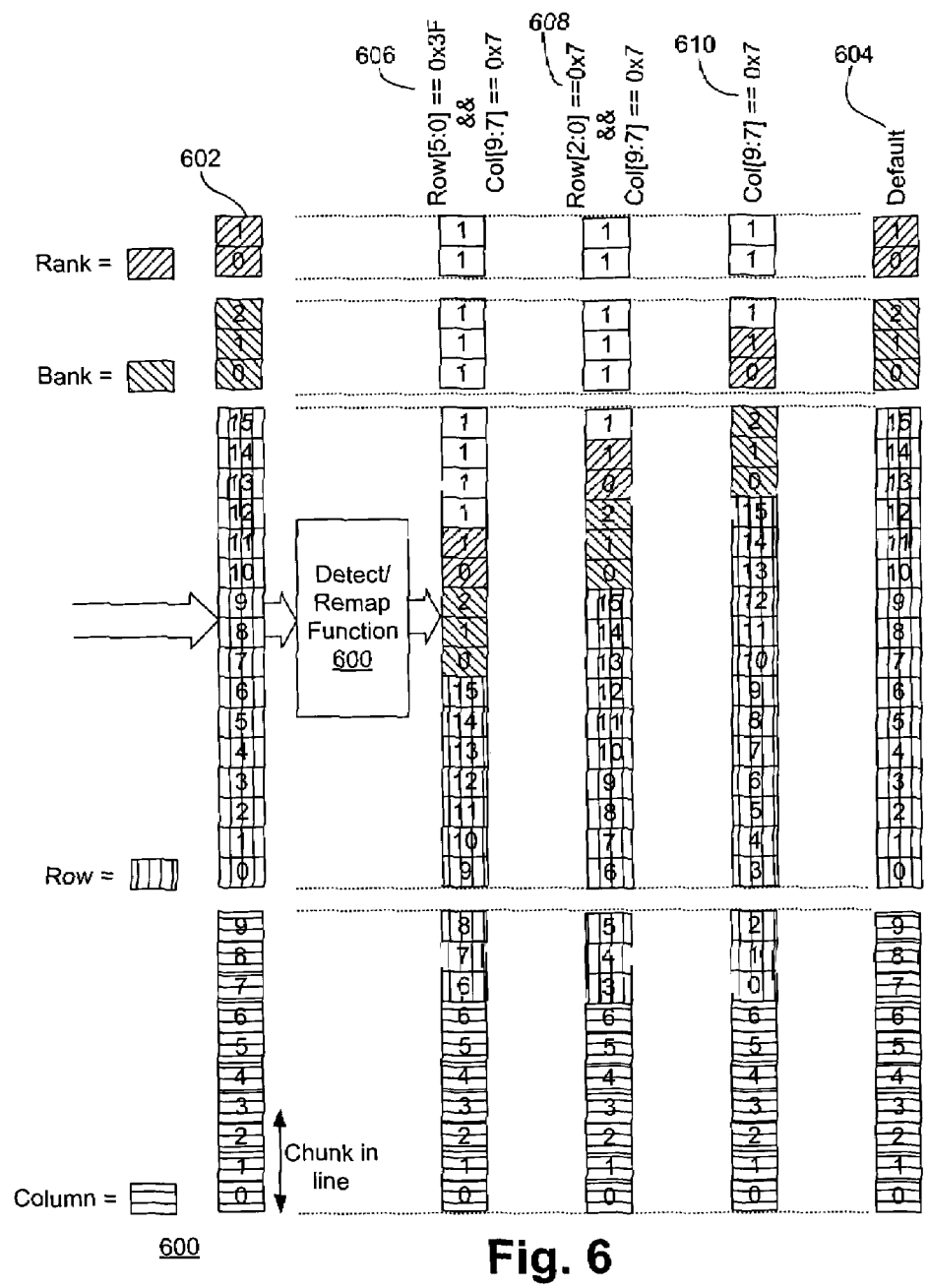
FIG. 6 illustrates selected aspects of an implementation of an address translation function according to an embodiment of the invention.

FIG. 6 illustrates selected aspects of "relocating" cache lines to a higher memory device address, according to an embodiment of the invention. Column 602 illustrates a processor address received by a memory controller (e.g., memory controller 120, shown in FIG. 1). In an embodiment, detect/remap function 600 receives the processor address and detects whether the address is directed to a cache line that has been relocated. The "detection" may be implemented with "ones detectors" (e.g., AND gates) to detect whether the processor address references a cache line that is relocated in memory. For example, conditions 606, 608, and 610 illustrate conditions for which detect/remap function 600 tests, according to an embodiment of the invention. In an embodiment, if conditions 606, 608, and 610 are true for processor address 602, then processor address 602 is remapped according to the columns that are, respectively, underneath conditions 606, 608, and 610. In an embodiment, the remapping is based on the highest priority (e.g., left most) match. For example, if the processor address is 0x02301F80, then the mapping under condition 610 is used. In an embodiment, no remapping is performed on processor address 602 if none of the conditions apply, as shown by default column 604.

The remapping may be performed by shifting the entire address right by a number (e.g., 3, 6, 9, . . . , etc.) of bit positions. In an embodiment, detect/remap function 600 inserts logical ones to replace the vacated bits (e.g., in the most significant bit positions). This process moves the cache lines to higher addresses in DRAM (e.g., to the highest numbered DRAM rank and bank). In an embodiment, the relocated cache line also includes error check bits and, therefore, some of the relocated cache lines may be relocated a second time. A smaller number of cache lines may also be relocated a third time. In an embodiment, these multiple relocated cache lines are detected by finding longer patterns of ones in the processor address (e.g., by detecting conditions 608 or 606). In these cases, the address is shifted further to the right by more bit positions as shown by the clear blocks in the columns underneath conditions 608 and 606 (e.g., by six or nine bits rather than three bits).

Figure 7:
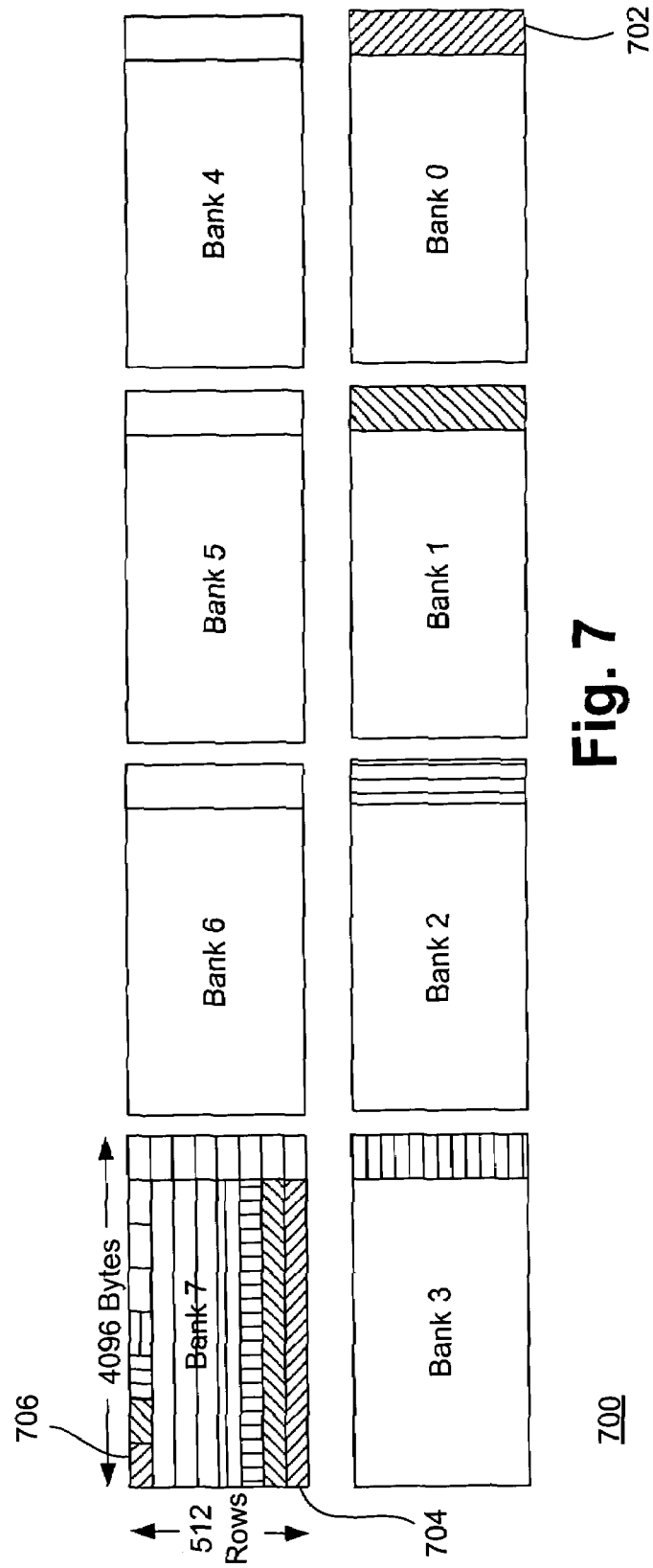
FIG. 7 is a block diagram illustrating selected aspects of how memory is reallocated in the error check mode according to an embodiment of the invention.

FIG. 7 is a block diagram illustrating selected aspects of how memory is reallocated in the error check mode according to an embodiment of the invention. Memory system 700 includes eight banks of memory. In an embodiment, 1/N of the capacity of each bank is used by error check code, if system 700 is operating in the error check mode. Region 702 is in the upper Nth region of bank 0. The cache lines that would ordinarily be mapped to region 702 are remapped to region 704 of bank 7. Since 1/N of bank 7 is also used for error check code, 1/N of the data that is remapped to region 704 is further remapped to region 706. In an alternative embodiment, different remapping schemes may be used.

Figure 8:
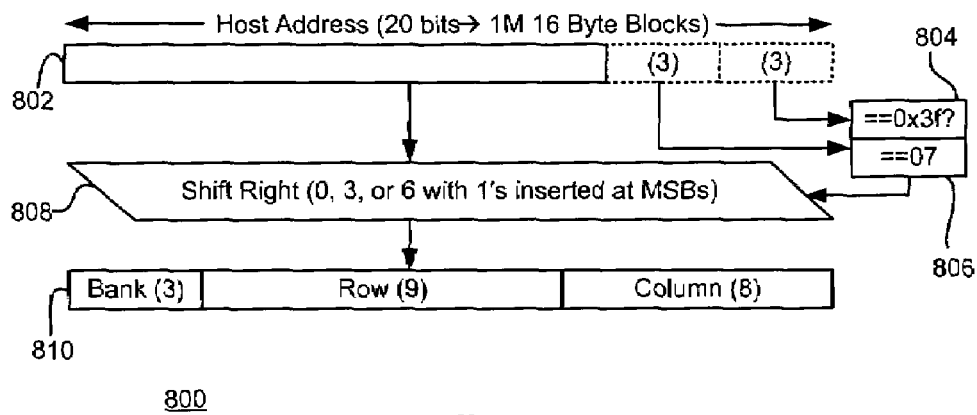
FIG. 8 illustrates a block diagram illustrating selected aspects of mapping memory addresses according to an embodiment of the invention.

FIG. 8 is a block diagram illustrating selected aspects of remapping processor addresses across multiple DRAM banks according to an embodiment of the invention. In the illustrated embodiment, processor address 802 is a 20 bit address (e.g., 1 MB of memory partitioned into 16 byte blocks) that is received by a memory controller. In the illustrated embodiment, ⅛ of the memory capacity is used for error check code, if the memory controller is in the error check mode. In an alternative embodiment, a different fraction of the memory capacity may be used for error check bits.

In an embodiment, when processor address 820 is in the first ⅞ of a row, no modification is made to the processor address. That is, the memory device address and the processor address are equal when the processor address is in the first ⅞ of the row. In an embodiment, detector 804 (e.g., implemented with AND gates) determines whether processor address 820 is in the upper ⅛ of the row address. If it is, then remapper 808 right shifts the address by three and shifts in ones at the most significant bits (MSBs). Similarly, detector 806 (e.g., implemented with AND gates) determines whether processor address 820 is in the upper ⅛ of a row in bank 7. Remapper 808 right shifts the address by an additional 3 bits and shifts in ones at the MSBs, if it is in the upper ⅛ of a row of bank 7. Thus, processor address 820 can be remapped to a higher region of memory by shifting in ones to 0, 3, or 6 of the MSBs of the address.

Figure 9:
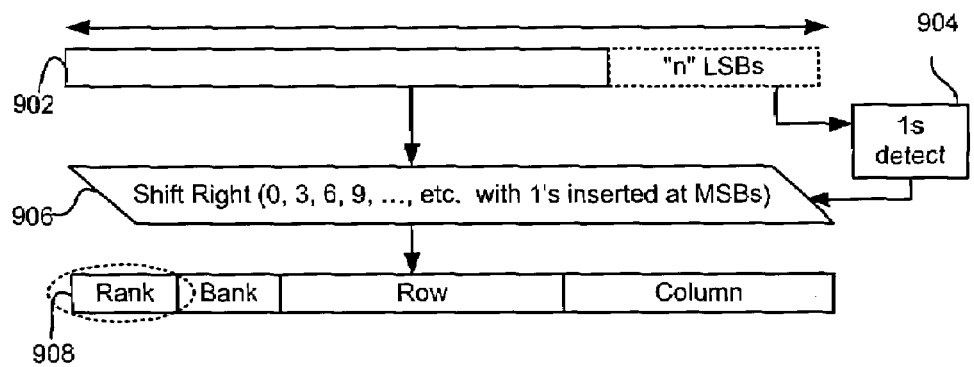
FIG. 9 is a block diagram illustrating selected aspects of mapping memory addresses according to an alternative embodiment of the invention.

In the embodiment described with reference to FIG. 8, the data is displaced within the same memory device. In an alternative embodiment, the data can be displaced across all of the ranks of memory within a memory channel. In such an embodiment, the data is, in general, displaced to a different memory device. FIG. 9 is a block diagram illustrating selected aspects of remapping processor addresses across multiple DRAM ranks according to an embodiment of the invention. Processor address 902 is, for example, a 20 bit address that is received by a memory controller. Detector 904 determines whether processor address 902 references a cache line that is displaced within memory. In an embodiment, detector 904 checks the rank bits of processor address 902 in addition to checking other bits of the address (e.g., row, column, and/or bank bits). If processor address 904 is directed to a relocated cache line, then remapper 906 right shifts the address by an appropriate number of bits (e.g., 0, 3, 6, 9, etc.) and fills in ones to the MSBs. The address is remapped across all of the ranks in memory because the rank bits are shifted and replaced (as needed) by remapper 906

Figure 10:
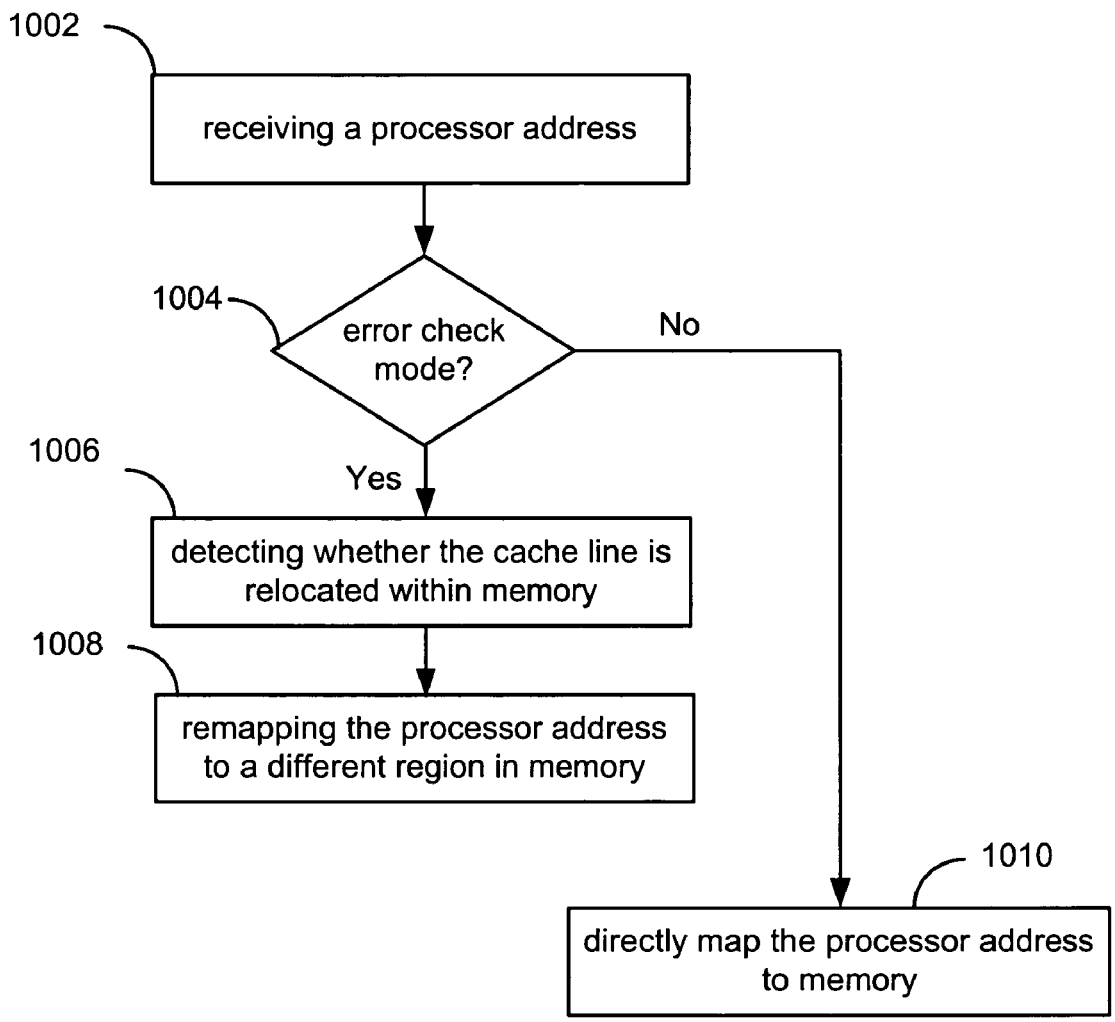
FIG. 10 is a flow diagram illustrating selected aspects of a method for remapping a processor address when a memory controller is operating in an error check mode, according to an embodiment of the invention.

FIG. 10 is a flow diagram illustrating selected aspects of a method for remapping a processor address when a memory controller is operating in an error check mode, according to an embodiment of the invention. In an embodiment, the memory controller is capable of operating in both an error check mode and a non-error check mode. When operating in the error check mode, a fraction of the memory capacity of the system (e.g., system 100, shown in FIG. 1) is used to store error check code (e.g., ECC). In an embodiment, the entire memory capacity is available to store data, when the system is operating in a non-error check mode.

Referring to process block 1002, a memory controller (e.g., memory controller 120, shown in FIG. 1) receives an address that references a memory location (e.g., a cache line) to be read from memory. The memory controller determines whether it is operating in the error check mode at 1004. In an embodiment, the memory controller references a mode indicator (e.g., a mode bit) to determine whether it is in the error check mode. If it is not operating in the error check mode, then the memory controller directly maps the processor address to a memory device address. That is, in an embodiment, there are no modifications to the processor address if the memory controller is not operating in the error check mode.

Referring to process block 1006, the memory controller determines whether the referenced cache line is relocated in memory. In an embodiment, the memory controller uses a detector (e.g., detector 123, shown in FIG. 1) to check selected row bits, column bits, bank bits, and/or rank bits of the processor address. The memory controller determines whether the referenced cache line is relocated in memory based, at least in part, on whether these bits are set (e.g., ones).

Referring to process block 1008, the memory controller remaps the processor address to a different region in memory, if necessary. The memory controller may include a remapper (e.g., remapper 125, shown in FIG. 1) to implement the remapping function. The remapper may right shift the processor address and fill in ones to remap the processor address to a different (e.g., higher) region in memory. In one embodiment, the processor address is remapped to a different region of memory in the same memory device. In an alternative embodiment, the processor address is remapped across all ranks of memory.

Figure 11A:
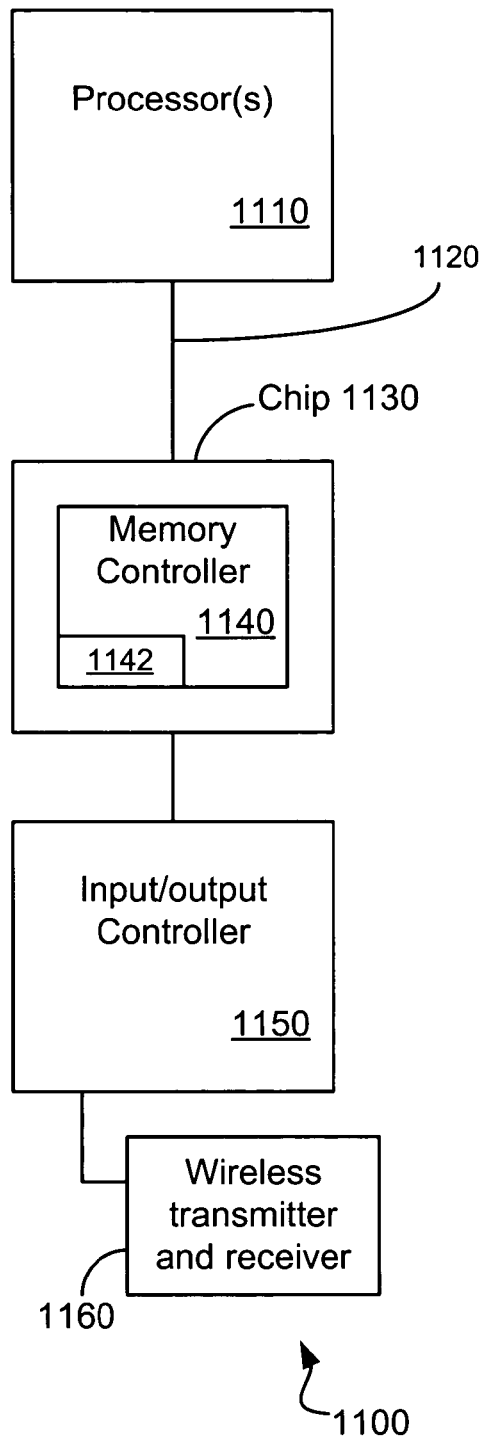
FIGS. 11A and 11B are block diagrams illustrating selected aspects of computing systems.
Figure 11B:
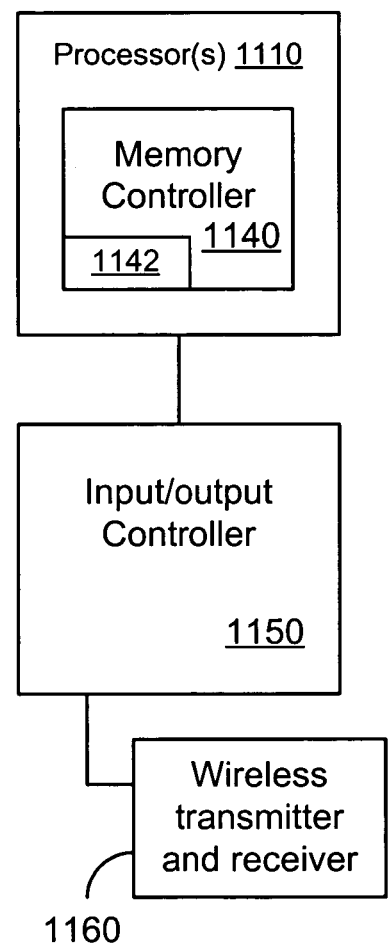

FIGS. 11A and 11B are block diagrams illustrating, respectively, selected aspects of computing systems 1100 and 1200. Computing system 1100 includes processor 1110 coupled with an interconnect 1120. In some embodiments, the term processor and central processing unit (CPU) may be used interchangeably. In one embodiment, processor 1110 is a processor in the XEON® family of processors available from Intel Corporation of Santa Clara, Calif. In an alternative embodiment, other processors may be used. In yet another alternative embodiment, processor 1110 may include multiple processor cores.

According to one embodiment, interconnect 1120 communicates with chip 1130. In one embodiment, chip 1130 is a component of a chipset. Interconnect 1120 may be a point-to-point interconnect or it may be connected to two or more chips (e.g., of the chipset). Chip 1130 includes memory controller 1140 which may be coupled with main system memory (e.g., as shown in FIG. 1). In an alternative embodiment, memory controller 1140 may be on the same chip as processor 1110 as shown in FIG. 11B. In an embodiment, address translation function 1142 translates a processor address to a memory device address, if the memory controller is operating in an error check mode.

Input/output (I/O) controller 1150 I/O controls the flow of data between processor 1110 and one or more I/O interfaces (e.g., wired and wireless network interfaces) and/or I/O devices. For example, in the illustrated embodiment, I/O controller 1150 controls the flow of data between processor 1110 and wireless transmitter and receiver 1160. In an alternative embodiment, memory controller 1140 and I/O controller 1150 may be integrated into a single controller.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. A memory device comprising:
   a mode indicator bit for specifying that the memory device is operating in an error check mode or a non-error check mode;
   a partitioned memory, a fraction of which is allocated for error check code (ECC) if the mode indicator bit specifies that the memory device is operating in the error check mode; and
   an output, coupled with the partitioned memory, having N error check bit paths for the ECC for every group of M data bit paths, the output to transfer N error check bits, with a corresponding group of M data bits, to a memory controller if the mode indicator bit specifies that the memory device is operating in the error check mode, wherein M is greater than N, and
   wherein the fraction of the partitioned memory allocated for the ECC is partitioned into chucks, the partitioned chunks located to cover every group of the M data bit paths.

2. The memory device of claim 1, wherein each of the N error check bit paths are interspersed within the corresponding group of M data bit paths.

3. The memory device of claim 1, wherein N is one and M is eight.

4. The memory device of claim 3, wherein the error check bit path is interspersed between two pairs of four data bit paths.

5. The memory device of claim 4, wherein the error check bit path is to provide an error correction code bit.

6. The memory device of claim 1, wherein the memory device is a dynamic random access memory device.

7. A system comprising:
   a memory device having:
      a mode indicator bit for specifying that the memory device is operating in an error check mode or a non-error check mode;
      a partitioned memory, a fraction of which is allocated for error check code (ECC) if the mode indicator bit specifies that the memory device is operating in the error check mode; and
      an output, coupled with the partitioned memory, including N error check bit paths for the ECC for every group of M data bit paths, the output to transfer N error check bits, with a corresponding group of M data bits, to a memory controller if the mode indicator bit specifies that the memory device is operating in the error check mode, wherein M is greater than N, and
      wherein the fraction of the partitioned memory allocated for the ECC is partitioned into chucks, the partitioned chunks located to cover every group of M data bit paths;
   the memory controller coupled with the memory device, wherein the memory controller is capable of operating in an error check mode and in a non-error check mode, wherein the memory controller includes:
      a mode indicator for specifying that the system is operating in the error check mode or the non-error check mode.

8. The system of claim 7, wherein each of the N error check bit paths are interspersed within the corresponding group of M data bit paths.

9. The system of claim 7, wherein the memory controller comprises:
   an address translation function, the address translation function to translate a processor address to a memory device address, if the apparatus is operating in the error check mode.

10. The system of claim 7, wherein the memory controller comprises:
    a mode indicator to specify whether the memory controller is operating in an error check mode or a non-error check mode; and
    an address translation function to translate a processor address to a memory device address, if the memory controller is operating in the error check mode.

11. A system comprising:
    a memory controller operable in an error check mode and in a non-error check mode; and
    a memory device coupled with the memory controller, the memory device having:
       a mode indicator bit for specifying that the memory device is operating in an error check mode or a non-error check mode;
       a partitioned memory, a fraction of which is allocated for error check code (ECC) if the mode indicator bit specifies that the memory device is operating in the error check mode; and
       an output, coupled with the partitioned memory, including N error check bit paths for the ECC for every group of M data bit paths, the output to transfer N error check bits, with a corresponding group of M data bits, to the memory controller if the mode indicator bit specifies that the memory device is operating in the error check mode, wherein M is greater than N, and wherein the fraction of the partitioned memory allocated for the ECC is partitioned into chucks, the partitioned chunks located to cover every group of the M data bit paths.

12. The system of claim 11, wherein each of the N error check bit paths are interspersed within the corresponding group of M data bit paths.

13. The system of claim 11, wherein the memory controller comprises:

a mode indicator to specify whether the memory controller is operating in the error check mode or the non-error check mode; and an address translation function to translate a processor address to a memory device address, if the memory controller is operating in the error check mode.

\* \* \* \* \*